United States Patent
Li

(10) Patent No.: US 10,673,010 B2
(45) Date of Patent: Jun. 2, 2020

(54) ELECTROLUMINESCENT DEVICE AND MANUFACTURING METHOD THEREOF

(71) Applicants: BOE Technology Group Co., Ltd., Beijing (CN); Hefei Xinsheng Optoelectronics Technology Co., Ltd., Hefei (CN)

(72) Inventor: Jiewei Li, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 167 days.

(21) Appl. No.: 15/574,740

(22) PCT Filed: May 23, 2017

(86) PCT No.: PCT/CN2017/085531
§ 371 (c)(1),
(2) Date: Nov. 16, 2017

(87) PCT Pub. No.: WO2018/001001
PCT Pub. Date: Jan. 4, 2018

(65) Prior Publication Data
US 2018/0233693 A1 Aug. 16, 2018

(30) Foreign Application Priority Data

Jul. 1, 2016 (CN) .......................... 2016 1 0515980

(51) Int. Cl.
*H01L 27/32* (2006.01)
*H01L 51/52* (2006.01)
(Continued)

(52) U.S. Cl.
CPC .......... *H01L 51/5228* (2013.01); *H01L 51/50* (2013.01); *H01L 51/5092* (2013.01);
(Continued)

(58) Field of Classification Search
None
See application file for complete search history.

(56) References Cited

U.S. PATENT DOCUMENTS

| 4,720,432 A | 1/1988 | VanSlyke et al. |
| 2003/0234609 A1* | 12/2003 | Aziz .................. H01L 51/5281 313/504 |

(Continued)

FOREIGN PATENT DOCUMENTS

| CN | 1499653 A | 5/2004 |
| CN | 101339976 A | 1/2009 |

(Continued)

OTHER PUBLICATIONS

Title: CN102593373A Machine Translation Translated date: Jun. 22, 2019 Publisher: European Patent office Pertinent Page: p. 6 (Year: 2019).*

(Continued)

*Primary Examiner* — Joseph C. Nicely
*Assistant Examiner* — Lamont B Koo
(74) *Attorney, Agent, or Firm* — Banner & Witcoff, Ltd.

(57) ABSTRACT

An electroluminescent device and a manufacturing method thereof are disclosed. The electroluminescent device includes a cathode layer and further includes an auxiliary cathode layer located on the cathode layer; a material of the auxiliary cathode layer (03) is at least one transparent metal.

6 Claims, 2 Drawing Sheets

(51) Int. Cl.
*H01L 51/56* (2006.01)
*H01L 51/50* (2006.01)

(52) U.S. Cl.
CPC .......... *H01L 51/52* (2013.01); *H01L 51/5225* (2013.01); *H01L 51/5234* (2013.01); *H01L 51/56* (2013.01); *H01L 2251/5315* (2013.01)

(56) References Cited

U.S. PATENT DOCUMENTS

| | | |
|---|---|---|
| 2004/0115474 A1 | 6/2004 | Albrecht et al. |
| 2014/0183479 A1* | 7/2014 | Park .................. H01L 51/56 257/40 |
| 2014/0209886 A1 | 7/2014 | Ishidai et al. |
| 2016/0043343 A1 | 2/2016 | Zhang |
| 2016/0141509 A1* | 5/2016 | Fuchiwaki .......... H01L 51/0061 257/40 |
| 2016/0240810 A1* | 8/2016 | Oh .................. H01L 51/5228 |
| 2017/0040572 A1 | 2/2017 | Gao et al. |
| 2017/0294624 A1 | 10/2017 | Xu et al. |

FOREIGN PATENT DOCUMENTS

| | | |
|---|---|---|
| CN | 101447555 A | 6/2009 |
| CN | 102593373 A | 7/2012 |
| CN | 103400943 A | 11/2013 |
| CN | 103531717 A | 1/2014 |
| CN | 104659271 A | 5/2015 |
| CN | 105493307 A | 4/2016 |
| CN | 106098955 A | 11/2016 |
| JP | 2002203685 A | 7/2002 |
| WO | 2013000164 A1 | 1/2013 |

OTHER PUBLICATIONS

Aug. 25, 2017—(WO) International Search Report and Written Opinion Appn PCT/CN2017/085531 with English Tran.
Jun. 28, 2017—(CN) First Office Action Appn 201610515980.8 with English Tran.

* cited by examiner

US 10,673,010 B2

ELECTROLUMINESCENT DEVICE AND MANUFACTURING METHOD THEREOF

CROSS-REFERENCE OF RELATED APPLICATIONS

The application is a U.S. National Phase Entry of International Application No. PCT/CN2017/085531 filed on May 23, 2017, designating the United States of America and claiming priority to Chinese Patent Application No. 201610515980.8 filed on Jul. 1, 2016. The present application claims priority to and the benefit of the above-identified applications and the above-identified applications are incorporated by reference herein in their entirety.

TECHNICAL FIELD

Embodiments of the present disclosure relate to the field of display technology, particularly to an electroluminescent device and a manufacturing method thereof.

BACKGROUND

Organic light-emitting diode (OLED) devices include top-emission type OLEDs. The top-emission OLED emits light from a cathode layer so that the cathode layer is required to possess not only excellent electron injection capability and relatively lower square resistance, but also better light transmittance.

Existing cathode layer has poor light transmittance, and has to be made extremely thin in order to ensure a better light transmittance. However, this may cause increased square resistance, raised driving voltage, and also decreased voltage stability. To solve such problem, the prior art proposes a solution in which a graphene auxiliary cathode layer is manufactured on the cathode layer. However, a material of the graphene auxiliary cathode layer is totally different in the type from that of the cathode layer, and hence has to be manufactured by a different process, which results in increased process-based complexity and reduced production efficiency.

SUMMARY

One of objectives of the embodiments of the present disclosure is to provide an electroluminescent device and a manufacturing method thereof, for solving the problem of reducing the square resistance without increasing the process-based complexity, on the premise of ensuring the electron injection capability and the light transmittance of the cathode layer.

According to a first aspect of the present disclosure, it provides an electroluminescent device. The electroluminescent device comprises a cathode layer, and further comprises an auxiliary cathode layer located on the cathode layer. A material of the auxiliary cathode layer is at least one transparent metal.

According to a second aspect of the present disclosure, it provides a manufacturing method of an electroluminescent device. The method includes: forming a cathode layer; and forming an auxiliary cathode layer on the cathode layer. A material of the auxiliary cathode layer is at least one transparent metal.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the present disclosure and thus are not limitative of the present disclosure.

DETAILED DESCRIPTION

Figure 1:
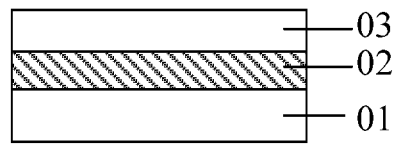
FIG. 1 is a structural schematic view of an electroluminescent device provided by an embodiment of the present disclosure.

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The thickness and the shape of film layers in the drawings are not intended to reflect actual scales but only for purpose of illustrating the contents of the present disclosure.

An embodiment of the present disclosure provides an electroluminescent device. As illustrated in FIG. 1, the electroluminescent device comprises a cathode layer 02 located on a substrate 01, for example, the cathode layer 02 is a co-evaporated film layer having at least one transparent metal; the electroluminescent device further comprises an auxiliary cathode layer 03 located on the cathode layer 02, and a material of the auxiliary cathode layer 03 is at least one transparent metal.

In the embodiment of the present disclosure, an auxiliary cathode layer is disposed on the cathode layer to increase a film layer thickness thereof; the auxiliary cathode layer having transparent metal which can well satisfy the requirements of devices for light transmittance, reduce the square resistance on the premise of ensuring the electron injection capability and the light transmittance, and facilitate increasing the stability of the driving voltage and the displaying quality. Moreover, the material for the cathode layer have the same transparent metal as the auxiliary cathode layer, so the cathode layer and the auxiliary cathode layer can be prepared by using a same process during manufacturing without increasing the process-based complexity, thereby facilitating the improvement of the production efficiency.

In at least some of the embodiments, the at least one transparent metal in the auxiliary cathode layer is the same as the at least one transparent metal in the co-evaporated film layer. In this way, the transparent metal contained in the auxiliary cathode layer is the same with the transparent metal contained in the cathode layer, so that the technology is further simplified and the production efficiency is further increased during the manufacturing process.

In at least some of the embodiments, the above-mentioned co-evaporated film layer further comprises an inorganic compound, a conductive organic compound, or a metal having a work function lower than that of the transparent metal in the co-evaporated film layer.

In other words, the co-evaporated film layer in the present embodiment may be a co-evaporated film layer of a transparent metal and an inorganic compound; may be a co-evaporated film layer of a transparent metal and a conductive organic compound; and may also be a co-evaporated film layer of a transparent metal and at least one metal having a work function lower than that of the transparent metal.

In at least some of the embodiments, the work function of the transparent metal in the co-evaporated film layer is higher than 4.0 eV; the work function of the metal in the co-evaporated film layer is lower than 4.0 eV. In the present embodiment, the transparent metal in the co-evaporated film layer is a transparent metal having a high work function, and the metal in the co-evaporated film layer is a transparent metallic layer having a low work function.

In at least some of the embodiments, the auxiliary cathode layer contains a plurality of types of transparent metals, for example, transparent metal argentums (Ag) or transparent metal aluminum (Al).

In at least some of the embodiments, the transparent metal in the co-evaporated film layer includes, but not limited to, transparent metal Ag or transparent metal Al. The metal having a work function lower than that of the transparent metal in the co-evaporated film layer includes, but not limited to, metal Magnesium (Mg), metal Calcium (Ca), metal Ytterbium (Yb) or metal Scandium (Sc). In the present embodiment, the transparent metal contained in the co-evaporated film layer is metals Ag and Al, which are transparent metals having high work function larger than 4.0 eV and are erosion resistant; the metal in the co-evaporated film layer adopts Mg, Ca, Yb or Sc, which is a metal having low work function smaller than 4.0 eV and may be used as an electron emission material.

In at least some of the embodiments, the co-evaporated film layer is made of a transparent metal and a metal having a work function lower than that of the transparent metal; the auxiliary cathode layer is made of the transparent metal of the co-evaporated film layer. For example, the transparent metal of the auxiliary cathode layer is transparent metal Ag; the transparent metal of the co-evaporated film layer is transparent metal Ag; and the metal having a work function lower than that of the transparent metal is metal Mg. In an example, a co-evaporation ratio of particle concentration of Mg to particle concentration of Ag in the co-evaporated film layer is ranged from 1:1 to 20:1; a film layer thickness of the co-evaporated film layer is ranged from 50 Å to 150 Å; a film layer thickness of the auxiliary cathode layer is ranged from 200 Å to 500 Å; an overall light transmittance of the co-evaporated film layer and the auxiliary cathode layer is ranged from 30% to 50%. In the present embodiment, the range of the co-evaporation ratio of the particle concentration of Mg to the particle concentration of Ag can effectively ensure the electron injection capability, and the thickness of the cathode layer is considerably reduced as compared to the thickness range of 100 Å~200 Å in the prior art. Moreover, in virtue of further disposing an auxiliary cathode layer such as a transparent metallic film layer of Ag on the cathode layer, the transparent metallic film layer of Ag can ensure better light transmittance while decreasing the square resistance. In addition, the cathode layer contains transparent metal Ag which is also used in the auxiliary cathode layer, thus the two layers can be prepared by a same process. Therefore, it achieves decreasing the square resistance without increasing the process-based complexity, on the premise of ensuring the electron injection capability and the light transmittance of the cathode layer.

In an example, the co-evaporation ratio of the particle concentration of Mg to the particle concentration of Ag in the co-evaporated film layer is ranged from 5:1 to 10:1.

Based on the foregoing embodiments, the inorganic compound includes, but not limited to, lithium fluoride (LiF). In view of this, in another possible embodiment, by way of example, the transparent metal in the auxiliary cathode layer is transparent metal Al; the transparent metal in the co-evaporated film layer is transparent metal Al, and the material of the inorganic compound is LiF. In the present embodiment, the range of co-evaporation ratio of the particle concentration of Al to the particle concentration of LiF in the co-evaporated film layer and the range of the film layer thickness and the like may be set according to actual requirements without particularly limited herein.

Based on the foregoing related embodiments, the conductive organic compound includes, but not limited to, quinoline lithium or derivative of phthalocyanin. Correspondingly, in yet another possible embodiment, by way of example, the transparent metal in the auxiliary cathode layer is transparent metal Al; the transparent metal in the co-evaporated film layer is transparent metal Al, and the material of the conductive organic compound is quinoline lithium. In the present embodiment, the range of co-evaporation ratio of the particle concentration of Al to the particle concentration of quinoline lithium in the co-evaporated film layer and the range of the film layer thickness and the like may be set according to actual requirements without particularly limited herein.

Figure 2A:
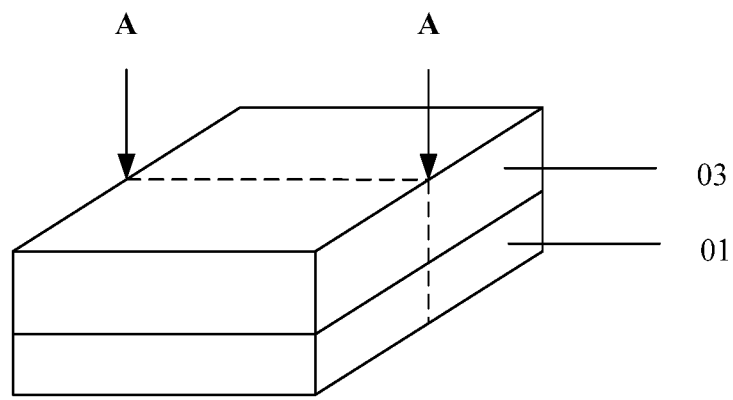
FIG. 2a and FIG. 2b are a perspective schematic view and a cross-sectional schematic view of another electroluminescent device provided by an embodiment of the present disclosure, respectively.
Figure 2B:
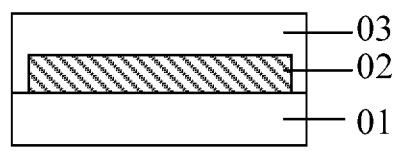

In an example, as illustrated in FIG. 2a and FIG. 2b, the auxiliary cathode layer 03 is formed to clad a main surface and a side surface of the cathode layer 02. In this way, the auxiliary cathode layer 03 serves to protect the cathode layer 02. FIG. 2b is a cross-sectional schematic view taken along A-A line of FIG. 2a. As it can be seen from FIG. 2b, the auxiliary cathode layer 03 is provided with a recess in which the cathode layer 02 is disposed, so that a top surface of the cathode layer 02 and a bottom of the recess are contacted with each other. An edge region of the recess and a surface of the substrate 01 are contacted with each other. The above-mentioned structure allows to seal the cathode layer between the substrate 01 and the auxiliary cathode layer 03, to effectively protect the cathode layer 02 and prevent ambient moisture or impurity from entering.

In an example, the electroluminescent device is a top-emission OLED.

Figure 3:
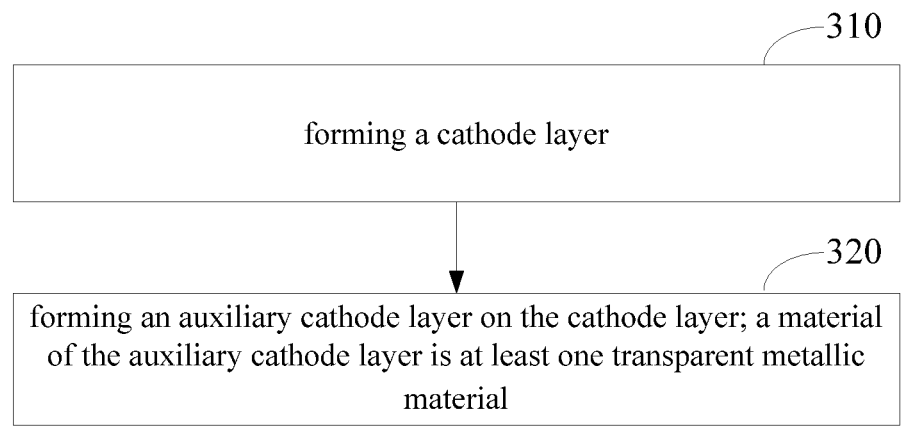
FIG. 3 is a flow chart of a manufacturing method of an electroluminescent device provided by an embodiment of the present disclosure.

The embodiments of the present disclosure further provide a manufacturing method of an electroluminescent device. As illustrated in FIG. 3, the method comprises at least the following steps.

Step S310, forming a cathode layer; for example, the cathode layer is a co-evaporated film layer having at least one transparent metal.

Step S320, forming an auxiliary cathode layer on the cathode layer; a material of the auxiliary cathode layer is at least one transparent metal.

In the embodiment of the present disclosure, an auxiliary cathode layer is disposed on the cathode layer to increase a film layer thickness thereof; the auxiliary cathode layer is made of a transparent metal which can well satisfy the requirements of devices for light transmittance, reduce the square resistance on the premise of ensuring the electron injection capability and the light transmittance, and facilitate increasing the stability of the driving voltage and the displaying quality. Moreover, the auxiliary cathode layer and the cathode layer both have a same transparent metal, and can be prepared by using a same process during manufacturing without increasing the process-based complexity, thereby facilitating the improvement of the production efficiency.

During the manufacturing process, an accurate control of a film layer thickness of the cathode layer, a film layer thickness of the auxiliary cathode layer, and an overall light transmittance of the cathode layer and the auxiliary cathode layer is one of important factors for obtaining devices with good stability. In the embodiment of the present disclosure, it needs to assign a preset film layer thickness of the cathode layer and a preset film layer thickness of the auxiliary cathode layer in accordance with a target overall light transmittance (i.e., an overall light transmittance required in actual practice) of the cathode layer and the auxiliary cathode layer. Therefore, it needs to calibrate, in advance, the preset film layer thickness of the cathode layer, the preset film layer thickness of the auxiliary cathode layer, and correspondingly an actual overall light transmittance of the cathode layer and the auxiliary cathode layer, so as to prevent from any influence to the control of other parameters of the device. For purpose of accurately controlling the preset film layer thickness of the cathode layer, the preset film layer thickness of the auxiliary cathode layer, and the actual overall light transmittance of the cathode layer and the auxiliary cathode layer, the embodiment of the present disclosure provides a corresponding calibration method.

In an example, before forming the cathode layer, the manufacturing method provided by the embodiment of the present disclosure further comprises:

determining a preset light transmittance of the cathode layer and a preset light transmittance of the auxiliary cathode layer, according to a target overall light transmittance of the cathode layer and the auxiliary cathode layer as required;

respectively determining a preset film layer thickness of the cathode layer and a preset film layer thickness of the auxiliary cathode layer, according to a predetermined fitting relation between the film layer thickness and the light transmittance of the cathode layer under different co-evaporation ratios, a predetermined fitting relation between the film layer thickness and the light transmittance of the auxiliary cathode layer under different co-evaporation ratios, as well as the preset light transmittance of the cathode layer and the preset light transmittance of the auxiliary cathode layer as determined;

forming the cathode layer on a substrate made of, for example clear glass, according to the preset film layer thickness of the cathode layer; forming the auxiliary cathode layer on the clear glass having been formed with the cathode layer, according to the preset film layer thickness of the auxiliary cathode layer; measuring an actual overall light transmittance of the cathode layer and the auxiliary cathode layer; comparing the actual overall light transmittance of the cathode layer and the auxiliary cathode layer with a target overall light transmittance to calculate a light transmittance tolerance, and determining whether the light transmittance tolerance is within a preset range;

if the light transmittance tolerance is within a preset range, then determining that the preset film layer thickness of the cathode layer and the preset film layer thickness of the auxiliary cathode layer have been calibrated correctly; if not, then adjusting the preset film layer thickness of the auxiliary cathode layer, according to a difference between the actual overall light transmittance and the target overall light transmittance as well as the fitting relation between the film layer thickness and the light transmittance of the auxiliary cathode layer.

In the above step S310, forming a cathode layer, for example, can be achieved by: forming the cathode layer on the substrate, at a corresponding co-evaporation ratio, according to the film layer thickness of the cathode layer having been calibrated correctly. In the above step S320, forming an auxiliary cathode layer on the cathode layer, for example, can be achieved by: forming the auxiliary cathode layer on the substrate having been formed with the cathode layer, according to the film layer thickness of the auxiliary cathode layer having been calibrated correctly.

In at least some of the embodiments, the fitting relation between the film layer thickness and the light transmittance of the auxiliary cathode layer can be determined by the following way: evaporating auxiliary cathode layers having different thicknesses and measuring light transmittances for each auxiliary cathode layers, then fitting each of the film layer thicknesses with a respective light transmittance as measured, so as to obtain the fitting relation.

In at least some of the embodiments, the fitting relation between the film layer thickness and the light transmittance of the cathode layer under different co-evaporation ratios can be determined by the following way: given a same co-evaporation ratio, evaporating cathode layers having different film layer thicknesses and measuring light transmittances for each cathode layers, then fitting each of the film layer thicknesses with a respective light transmittance as measured, so as to obtain the fitting relation. The film layer thickness of the cathode layer as evaporated is within a preset thickness range. The preset thickness range may be for example 200 Å~800 Å; in an example, the preset thickness range is 300 Å~500 Å. In this way, the preset film layer thickness is relatively larger, and an influence on the film layer thickness resulted from an oxidation of the cathode layer, if happened, will be small enough to be ignored, so that the fitting relation as obtained will be more accurate.

Hereinafter, an electroluminescent device and a manufacturing method thereof provided by the embodiments of the present disclosure will be described in more details with reference to the case where the electroluminescent device is a top-emission OLED, by way of example.

Figure 4:
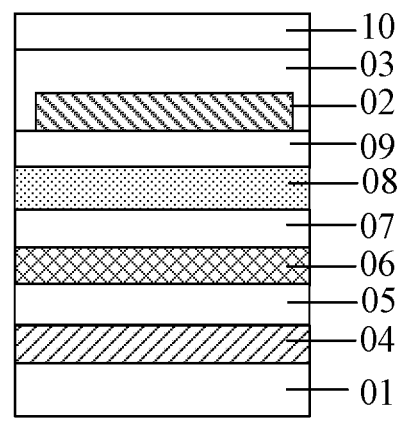
FIG. 4 is a structural schematic view of yet another electroluminescent device provided by an embodiment of the present disclosure.

A specific structure of the electroluminescent device in the present embodiment is illustrated in FIG. 4. The electroluminescent device comprises: a substrate 01; and an anode layer 04, a hole injection layer 05, a hole transport layer 06, an electroluminescent layer 07, an electron transport layer 08, an electron injection layer 09, a cathode layer 02, an auxiliary cathode layer 03 and a light extraction layer 10 which are sequentially stacked on the substrate 01. For example, the cathode layer 02 is a co-evaporated film layer of a metal Mg and a transparent metal Ag; the auxiliary cathode layer 03 is an Ag film layer formed to clad a main surface and a side surface of the cathode layer 02 so as to protect the cathode layer 02.

In the co-evaporated film layer of Mg and Ag, the co-evaporation ratio of the particle concentration of Mg to the particle concentration of Ag is ranged from 5:1 to 10:1; the film layer thickness of the co-evaporated film layer of Mg and Ag is ranged from 50 Å to 150 Å; the film layer thickness of the Ag film layer is ranged from 200 Å to 500 Å; the overall light transmittance of the Ag film layer and the co-evaporated film layer of Mg and Ag is ranged from 30% to 50%.

Hereinafter the manufacturing flow of the electroluminescent device as illustrated in FIG. 4 will be specifically described.

I. Calibrating, in advance, a preset film layer thickness of the Ag film layer, a preset film layer thickness of the co-evaporated film layer of Mg and Ag, and an actual overall light transmittance of the Ag film layer and the co-evaporated film layer of Mg and Ag.

First of all, predetermining a fitting relation between the film layer thickness and the light transmittance of the Ag film layer; for example, evaporating Ag film layers having different film layer thicknesses and measuring light transmittance for each Ag film layers, then fitting each of the film layer thicknesses with a respective light transmittance as measured, so as to obtain the fitting relation between the film layer thickness and the light transmittance of the Ag film layer. It also needs to predetermine a fitting relation between the film layer thickness and the light transmittance of the co-evaporated film layer of Mg and Ag under an actually required co-evaporation ratio; for example, under the actually required co-evaporation ratio, evaporating co-evaporated film layers of Mg and Ag having different film layer thicknesses and measuring light transmittances for each co-evaporated film layers, then fitting each of the film layer thicknesses with a respective light transmittance as measured, so as to obtain the fitting relation between the film layer thickness and the light transmittance of the co-evaporated film layer of Mg and Ag. The film layer thickness of the co-evaporated film layer of Mg and Ag is ranged from 300 Å to 500 Å.

Subsequently, determining a preset light transmittance of the co-evaporated film layer of Mg and Ag and a preset light transmittance of the Ag film layer, according to a target overall light transmittance of the Ag film layer and the co-evaporated film layer of Mg and Ag as required under visible light of 500 nm wavelength. The target overall light transmittance is ranged from 30% to 50%. Respectively determining a preset film layer thickness of the co-evaporated film layer of Mg and Ag and a preset film layer thickness of the Ag film layer, based on the fitting relation between the film layer thickness and the light transmittance of the Ag film layer as determined above, the fitting relation between the film layer thickness and the light transmittance of the co-evaporated film layer of Mg and Ag under the actually required co-evaporation ratio as determined above, as well as the preset light transmittance of the co-evaporated film layer of Mg and Ag and the preset light transmittance of the Ag film layer as determined.

Forming the co-evaporated film layer of Mg and Ag on a clear glass at a corresponding co-evaporation ratio, according to the preset film layer thickness of the co-evaporated film layer of Mg and Ag as determined; evaporating the Ag film layer on the co-evaporated film layer of Mg and Ag, according to the preset film layer thickness of the Ag film layer as determined; measuring an actual overall light transmittance of the Ag film layer and the co-evaporated film layer of Mg and Ag under visible light of 500 nm wavelength by using an ultraviolet and visible spectrophotometer; comparing the actual overall light transmittance as measured with a target overall light transmittance as required by the Ag film layer and the co-evaporated film layer of Mg and Ag to calculate a light transmittance tolerance; and determining whether the light transmittance tolerance is within a preset range; if so, then determining that the preset film layer thickness of the co-evaporated film layer of Mg and Ag and the preset film layer thickness of the Ag film layer have been calibrated correctly; if not, then adjusting the preset film layer thickness of the Ag film layer, according to a difference between the actual overall light transmittance and the target overall light transmittance, as well as the fitting relation between the film layer thickness and the light transmittance of the Ag film layer, so as to fit a difference between the actual overall light transmittance and the target overall light transmittance into a preset tolerance range.

II. In addition to the above steps, the following manufacturing steps are performed.

Step I, sequentially forming an anode layer 04, a hole injection layer 05, a hole transport layer 06, an electroluminescent layer 07, an electron transport layer 08 and an electron injection layer 09 which are stacked on the substrate.

Step II, evaporating a co-evaporated film layer of Mg and Ag (i.e., the cathode layer 02) on the substrate formed upon Step I, according to an actually required co-evaporation ratio and the film layer thickness of the co-evaporated film layer of Mg and Ag having been correctly calibrated.

Step III, evaporating a Ag film layer (i.e., the auxiliary cathode layer 03) on the substrate having the co-evaporated film layer of Mg and Ag formed thereon, to clad a surface of the co-evaporated film layer of Mg and Ag, according to the film layer thickness of the Ag film layer having been correctly calibrated.

Step IV, forming a light extraction layer 10 on the Ag film layer.

In the embodiment of the present disclosure, an auxiliary cathode layer is disposed on the cathode layer to increase a film layer thickness thereof; the auxiliary cathode layer adopts a transparent metal which can well satisfy the requirements of devices for light transmittance, reduce the square resistance on the premise of ensuring the electron injection capability and the light transmittance, and facilitate increasing the stability of the driving voltage and the displaying quality; moreover, the auxiliary cathode layer and the cathode layer both have a transparent metal, and can be prepared by using a same process during manufacturing without increasing the process-based complexity, thereby facilitating the improvement of the production efficiency.

The foregoing are merely specific embodiments of the invention, but not limitative to the protection scope of the invention. The protection scope of the invention shall be defined by the accompanying claims.

What is claimed is:

1. A manufacturing method of an electroluminescent device, comprising:

forming a cathode layer; and forming an auxiliary cathode layer on the cathode layer, a material of the auxiliary cathode layer being at least one transparent metal, wherein before forming the cathode layer, the manufacturing method further comprises:

determining a preset light transmittance of the cathode layer and a preset light transmittance of the auxiliary cathode layer, according to a target overall light transmittance of the cathode layer and the auxiliary cathode layer as required;

respectively determining a preset thickness of the cathode layer and a preset thickness of the auxiliary cathode layer, according to a predetermined fitting relation between a thickness and a light transmittance of the cathode layer under different co-evaporation ratios, a predetermined fitting relation between a thickness and a light transmittance of the auxiliary cathode layer, as well as the preset light transmittance of the cathode layer and the preset light transmittance of the auxiliary cathode layer as obtained;

forming the cathode layer on a substrate according to the preset thickness of the cathode layer; forming the auxiliary cathode layer on the substrate having the cathode layer formed thereon according to the preset thickness of the auxiliary cathode layer; measuring an actual overall light transmittance of the cathode layer and the auxiliary cathode layer; comparing the actual overall light transmittance of the cathode layer and the auxiliary cathode layer with the target overall light transmittance to calculate a light transmittance tolerance; and determining whether the light transmittance tolerance is within a preset range;

if the light transmittance tolerance is within the preset range, determining that the preset thickness of the cathode layer and the preset thickness of the auxiliary cathode layer have been calibrated correctly; and if the light transmittance tolerance is beyond the preset range, adjusting the preset thickness of the auxiliary cathode layer according to a difference between the actual overall light transmittance and the target overall light transmittance of the cathode layer and the auxiliary cathode layer, as well as the fitting relation between the thickness and the light transmittance of the auxiliary cathode layer.

2. The manufacturing method according to claim 1, wherein the forming the cathode layer comprises:

forming the cathode layer on the substrate at a corresponding co-evaporation ratio, according to the thickness of the cathode layer having been correctly calibrated.

3. The manufacturing method according to claim 2, wherein the forming the auxiliary cathode layer on the cathode layer comprises:

forming the auxiliary cathode layer on the substrate having the cathode layer formed thereon, according to the thickness of the auxiliary cathode layer having been correctly calibrated.

4. The manufacturing method according to claim 1, wherein the determining the fitting relation between the thickness and the light transmittance of the auxiliary cathode layer comprises: evaporating auxiliary cathode layers having different thicknesses and measuring light transmittances for each of the auxiliary cathode layers, and fitting each of the thicknesses with a respective light transmittance as measured, so as to obtain the fitting relation; and the determining the fitting relation between the thickness and the light transmittance of the cathode layer under different co-evaporation ratios comprises: given a same co-evaporation ratio, evaporating cathode layers having different thicknesses and measuring light transmittances for each of the cathode layers, and fitting each of the thicknesses with a respective light transmittance as measured, so as to obtain the fitting relation, wherein the thickness of the cathode layer as evaporated is within a preset thickness range.

5. The manufacturing method according to claim 1, wherein the cathode layer is a co-evaporated film layer having at least one transparent metal.

6. An electroluminescent device, comprising:

a base substrate;

a cathode layer, located on the base substrate and configured to be a co-evaporated film layer, the co-evaporated film layer has a single-layer structure without an electrode injection layer; and an auxiliary cathode layer, located on a side of the cathode layer away from the base substrate and configured to enclose the cathode layer, a material of the auxiliary cathode layer being at least one transparent metal, wherein the co-evaporated film layer comprises at least one transparent metal same as the at least one transparent metal in the auxiliary cathode layer, and the co-evaporated film layer further comprises a metal which has a work function lower than that of the at least one transparent metal, wherein the at least one transparent metal in the co-evaporated film layer is transparent metal Ag or transparent metal Al, the metal having a work function lower than that of the at least one transparent metal in the co-evaporated film layer is metal Mg, wherein a co-evaporation ratio of a particle concentration of Mg to a concentration of Ag in the co-evaporated film layer is ranged from 1:1 to 20:1, a thickness of the co-evaporated film layer is ranged from 50 Å to 150 Å, a thickness of the auxillary cathode layer is ranged from 200 Å to 500, and an overall light transmittance of the co-evaporated film layer and the auxillary cathode layer is ranged from 30% to 50%.

* * * * *